(12) United States Patent
Moore et al.

(10) Patent No.: US 10,263,504 B2
(45) Date of Patent: Apr. 16, 2019

(54) SYNCHRONIZING INTERVAL DATA DESPITE LOSS OF TIME

(71) Applicant: Honeywell International Inc., Morris Plains, NJ (US)

(72) Inventors: Daniel R. Moore, Raleigh, NC (US); Robert T. Mason, Raleigh, NC (US)

(73) Assignee: Honeywell International Inc., Morris Plains, NJ (US)

( * ) Notice: Subject to any disclaimer, the term of this patent is extended or adjusted under 35 U.S.C. 154(b) by 136 days.

(21) Appl. No.: 15/183,696

(22) Filed: Jun. 15, 2016

(65) Prior Publication Data
US 2016/0363956 A1    Dec. 15, 2016

Related U.S. Application Data

(60) Provisional application No. 62/175,942, filed on Jun. 15, 2015.

(51) Int. Cl.
| | |
|---|---|
| *G06F 1/14* | (2006.01) |
| *G06F 1/26* | (2006.01) |
| *G06F 1/30* | (2006.01) |
| *H02M 1/00* | (2006.01) |
| *G06F 11/14* | (2006.01) |
| *G06F 11/34* | (2006.01) |

(52) U.S. Cl.
CPC ............. *H02M 1/00* (2013.01); *G06F 1/30* (2013.01); *G06F 11/1471* (2013.01); *G06F 1/14* (2013.01); *G06F 1/26* (2013.01); *G06F 11/3476* (2013.01)

(58) Field of Classification Search
CPC .......... G06F 1/26; G06F 1/30; G06F 11/1471; G06F 1/14; G06F 11/3476; H02M 1/00
USPC ................ 713/400, 300; 714/15, 20, 22
See application file for complete search history.

(56) References Cited

U.S. PATENT DOCUMENTS

| | | | | |
|---|---|---|---|---|
| 4,933,633 | A  * | 6/1990 | Allgood ................ | G01F 1/684 324/116 |
| 5,918,380 | A  * | 7/1999 | Schleich ............... | G01D 4/006 340/870.02 |
| 2007/0300094 | A1* | 12/2007 | Frazier ................. | G06F 1/14 713/400 |
| 2008/0244281 | A1* | 10/2008 | Felter .................... | G06F 1/28 713/300 |
| 2014/0309956 | A1* | 10/2014 | Mondot ................ | G01R 22/10 702/61 |
| 2016/0103163 | A1* | 4/2016 | Schamber ............ | G01R 22/10 702/61 |

\* cited by examiner

*Primary Examiner* — Ji H Bae
(74) *Attorney, Agent, or Firm* — BakerHostetler

(57) ABSTRACT

A meter mechanism and method are disclosed for recording relative interval data accumulated when the meter loses real time due to a power failure and synchronizing the relative interval data with real-time intervals in the meter memory. The disclosed meter mechanism and method ensure that all usage is accounted for while the meter is online, the metered usage is closer to the actual interval boundaries in which the usage occurred, accounts for all real time intervals in a day, and is power fail tolerant during both the analysis and synchronization.

20 Claims, 6 Drawing Sheets

SYNCHRONIZING INTERVAL DATA DESPITE LOSS OF TIME

CROSS REFERENCE TO RELATED APPLICATIONS

The present application claims the benefit of, and priority to, U.S. Provisional Application No. 62/175,942, filed Jun. 15, 2015, the entire contents of which is incorporated by reference into this application.

BACKGROUND

Interval data is captured by utility meters corresponding to usage during specific timespans within a day. For example, a meter configured to measure 15 minute intervals should accumulate and log data at each 15 minute boundary, with the first interval boundary for any given day beginning at 15 minutes after midnight (i.e., 00:15:00). A problem is encountered when, due to a power outage of long duration, the meter has lost its knowledge of real time due to the expiration of charge necessary to maintain operation of a real-time clock (RTC). Upon power restoration, interval data must be collected and logged despite the meter lacking knowledge of the actual real time.

SUMMARY

Described herein are embodiments of a method to record real time interval data when a meter loses real time due to a power failure, and embodiments of methods to synchronize that "relative" interval data into real time intervals, when notification of the real time is received. In one embodiment, the meter measures consumption of electricity and includes a real-time clock to maintain a measure of time. The meter receives a real-time clock value reflecting a measure of real time and measures energy consumption during successive real time intervals that are each aligned to a real-time clock boundary. And for each real time interval, the meter stores data indicative of the measured energy consumption in a respective memory location representing that real time interval. In response to a power outage that results in the loss of the measure of real time, the meter establishes a relative start time and measures energy consumption during successive relative time intervals following restoration of power. Each relative time interval is measured relative to the relative start time, and for each relative time interval, the meter stores data indicative of the measured energy consumption in a respective memory location representing that relative time interval. Upon receiving an updated real time clock value reflecting the measure of real time, the meter synchronizes the relative time interval data stored after restoration of power with the interval data stored prior to the power outage by moving the data stored in the memory locations representing the relative time intervals to memory locations representing intervals based on the received updated real time clock value.

In another embodiment, a metering device includes a real-time clock to maintain a measure of time, a processor and a memory, the memory containing computer executable instructions that, when executed by the processor, cause the metering device to: receive a real-time clock value reflecting a measure of real time, measure energy consumption during successive real time intervals, each real time interval being aligned to a real-time clock boundary, store data indicative of the measured energy consumption in a respective memory location representing that real time interval, establish a relative start time in response to a power outage that results in the loss the measure of real time, measure energy consumption during successive relative time intervals following restoration of power, each relative time interval being measured relative to the relative start time, store data indicative of the measured energy consumption in a respective memory location representing that relative time interval, and upon receiving an updated real time clock value reflecting the measure of real time, synchronize the relative time interval data stored after restoration of power with the real time interval data stored prior to the power outage, by moving the data stored in memory locations representing the relative time intervals to memory locations representing real time intervals based on the received updated real time clock value.

In another embodiment, a metering device includes a real-time clock to maintain a measure of time, a processor and a memory, the memory containing computer executable instructions that, when executed by the processor, cause the metering device to: receive a real-time clock value reflecting a measure of real time, measure energy consumption during successive real time intervals, each real time interval being aligned to a real-time clock boundary, store data indicative of the measured energy consumption in a respective memory location representing that real time interval, establish a relative start time in response to a power outage that results in the loss the measure of real time, measure energy consumption during successive relative time intervals following restoration of power, each relative time interval being measured relative to the relative start time, store data indicative of the measured energy consumption in a respective memory location representing that relative time interval, and upon receiving an updated real time clock value reflecting the measure of real time, synchronize the relative time interval data stored after restoration of power with the real time interval data stored prior to the power outage, by moving the data stored in memory locations representing the relative time intervals to memory locations representing real time intervals based on the received updated real time clock value.

BRIEF DESCRIPTION OF THE DRAWINGS

The foregoing summary, as well as the following detailed description of illustrative embodiments, will be better understood when read in conjunction with the appended drawings. In the drawings.

DESCRIPTION OF THE INVENTION

Described herein is a mechanism for use in a meter, such as a meter that measures the consumption of electricity at a utility customer location, to record real-time interval data in situations where the meter loses real time due to a power failure, and where each interval is aligned to a real-time clock boundary (e.g., 00:15:00, 00:30:00). In one embodiment, the mechanism may be used in a metering device where interval data is not stored in memory at a high resolution (e.g., 1 second intervals), but is rather captured in relative intervals equal to the duration of the actual interval length (e.g., 15 minute intervals). When the mechanism receives notification of the real time, it synchronizes interval data accumulated during the unknown or "relative" period into the actual periods in which they occurred. That is, once the real time within the meter is restored, the meter synchronizes the interval data accumulated during the unknown or "relative" periods by moving that data into respective data memory locations corresponding to the restored real time intervals in which they occurred.

Figure 1:
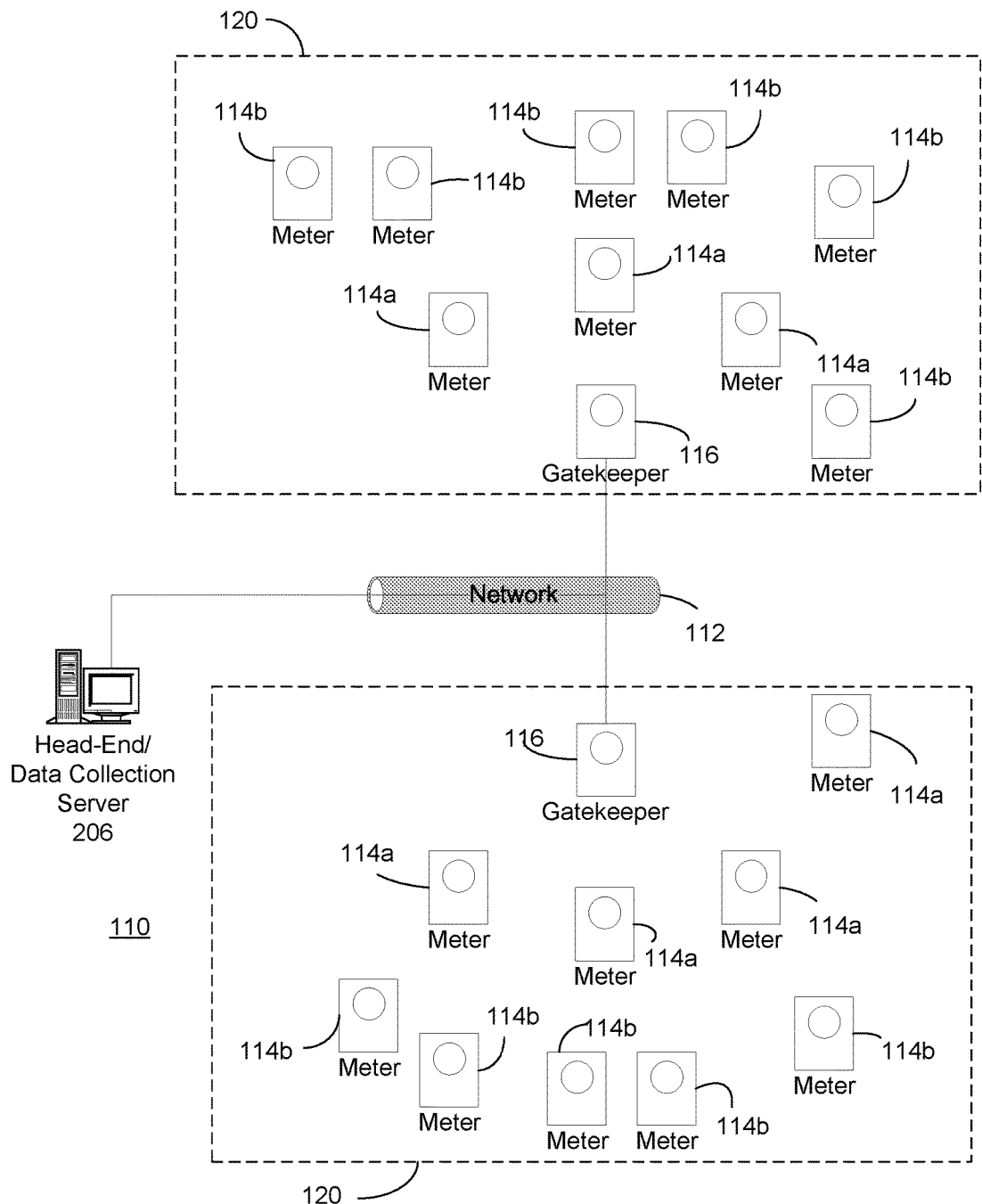
FIG. 1 illustrates one example metering system.

FIG. 1 illustrates one example of a metering system 110 comprising a plurality of meters 114, in which the mechanisms and methods disclosed herein may be employed. Meters 114 are operable to sense and record consumption or usage of a service or commodity such as, for example, electricity, water, or gas. Meters 114 may be located at customer premises such as, for example, a home or place of business. Meters 114 comprise circuitry for measuring the consumption of the service or commodity being consumed at their respective locations and for generating data reflecting the consumption, such as interval data, as well as other data related thereto. Meters 114 may also comprise circuitry for wirelessly transmitting data generated by the meter to a remote location. Meters 114 may further comprise circuitry for receiving data, commands or instructions wirelessly as well. Meters that are operable to both receive and transmit data may be referred to as "bi-directional" or "two-way" meters, while meters that are only capable of transmitting data may be referred to as "transmit-only" or "one-way" meters. In bi-directional meters, the circuitry for transmitting and receiving may comprise a transceiver.

System 110 further comprises gatekeepers 116. In one embodiment, gatekeepers 116 are also meters operable to detect and record usage of a service or commodity such as, for example, electricity, water, or gas. In addition, gatekeepers 116 are operable to send data to and receive data from meters 114. Thus, like the meters 114, the gatekeepers 116 may comprise both circuitry for measuring the consumption of a service or commodity and for generating data reflecting the consumption and circuitry for transmitting and receiving data. In one embodiment, gatekeeper 116 and meters 114 communicate with and amongst one another using any one of several wireless techniques such as, for example, frequency hopping spread spectrum (FHSS) and direct sequence spread spectrum (DSSS).

A gatekeeper 116 and the meters 114 with which it communicates may define a subnet/LAN 120 of system 110. As used herein, meters 114 and gatekeepers 116 may be referred to as "metering devices" or "meter devices" in the subnet 120. In each subnet/LAN 120, each meter transmits data related to consumption of the commodity being metered at the meter's location. The gatekeeper 116 receives the data transmitted by each meter 114, effectively "collecting" it, and then periodically transmits the data from all of the meters in the subnet/LAN 120 to a data collection server or head-end system 206. The data collection server 206 stores the data for analysis and preparation of bills, for example. The data collection server 206 may be a specially programmed general purpose computing system and may communicate with gatekeepers 116 via a network 112. The network 112 may comprise any form of network, including a wireless network or a fixed-wire network, such as a local area network (LAN), a wide area network, the Internet, an intranet, a telephone network, such as the public switched telephone network (PSTN), a Frequency Hopping Spread Spectrum (FHSS) radio network, an ISM mesh network, a Wi-Fi (802.11) network, a Wi-Max (802.16) network, a land line (POTS) network, a cellular network, or any combination of the above.

Figure 2A:
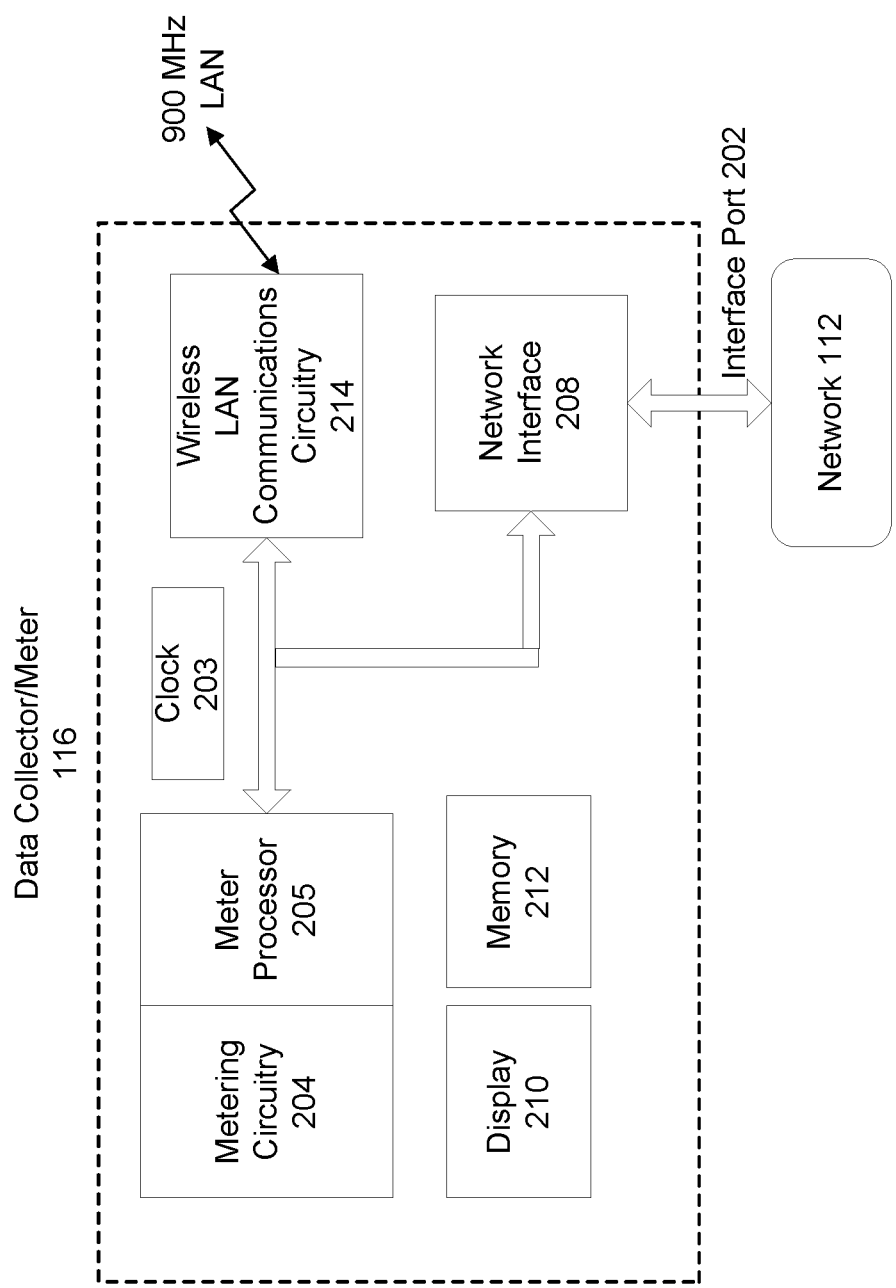
FIG. 2A illustrates a schematic of a gatekeeper device/meter, according to an aspect of the disclosure.

FIG. 2A is a block diagram illustrating further details of one embodiment of a gatekeeper 116. Although certain components are designated and discussed with reference to FIG. 2A, it should be appreciated that the invention is not limited to such components. In fact, various other components typically found in an electronic meter may be a part of gatekeeper 116, but have not been shown in FIG. 2A for the purposes of clarity and brevity. The components that are shown and the functionality described for gatekeeper 116 are provided as examples, and are not meant to be exclusive of other components or other functionality.

As shown in FIG. 2A, gatekeeper 116 may comprise metering circuitry 204 that performs measurement of consumption of a service or commodity and a processor 205 that controls the overall operation of the metering functions of the gatekeeper 116. The gatekeeper 116 may further comprise a display 210 for displaying information such as measured quantities and meter status and a memory 212 for storing data. The gatekeeper 116 further comprises wireless LAN communications circuitry 214 for communicating wirelessly with the meters 114 in a subnet/LAN and a network interface 208 for communication over the network 112. As further shown, the gatekeeper 116 includes a clock circuit 203. The clock circuit 203 for the gatekeeper 116 may run off an internal 12 MHz crystal and may be adjusted from the central station on a daily basis (or more often). During outages, the clock circuit 203 may keep using a 32 kHz crystal. In an alternative embodiment, the gatekeeper 116 may use a 60 Hz line frequency for additional timing accuracy adjustments.

In one embodiment, the wireless LAN communications circuitry 214 may be implemented by a 900 MHz two-way radio (i.e., transceiver) installed within the meter, and the network interface 208 may be implemented by a telephone modem or the like also installed within the meter. The network interface 208 routes messages from network 112 (via interface port 202) to either the meter processor 205 or the LAN communications circuitry. The gatekeeper 116 typically has sufficient memory to store data received from meters 114. This data may include, but is not limited to the following: current billing data (e.g., the present values stored and displayed by meters 114), previous billing period data, previous season data, interval data, and load profile data.

Figure 2B:
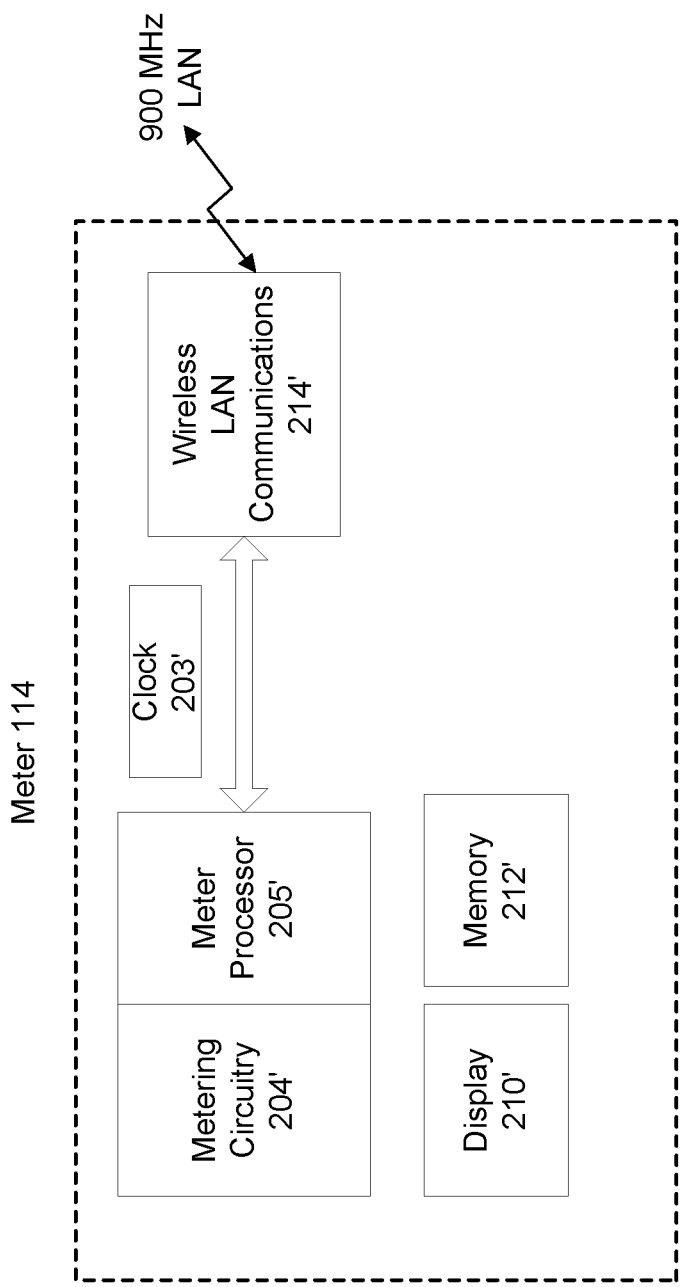
FIG. 2B illustrates a schematic of a meter device, in which the mechanisms and methods disclosed herein may be embodied.

FIG. 2B is a block diagram of an exemplary embodiment of a meter 114 that may operate in the system 110 of FIG. 1. As shown, the meter 114 comprises metering circuitry 204' for measuring the amount of a service or commodity that is consumed and circuitry for generating data reflecting the consumption, a processor 205' that controls the overall functions of the meter, a display 210' for displaying meter data and status information, and a memory 212' for storing data and program instructions. The meter 114 further comprises wireless communications circuitry 214' for transmitting and receiving data to/from other meters 114 or a gatekeeper 116. The wireless communications circuitry 214' may be similar to or identical to the wireless communication circuitry 214 in the gatekeeper 116 of FIG. 2A. The meter 114 also comprises a clock circuit 203' like the gatekeeper 116. The clock circuit 203' may be similar or identical to the clock circuit 203 used in the gatekeeper 116.

The gatekeeper 116 is responsible for managing, processing and routing data communicated between the gatekeeper and network 112 and between the gatekeeper and meters 114. Gatekeeper 116 may continually or intermittently receive current data from meters 114 and store the data in memory 212 or a database (not shown) in gatekeeper 116. Such current data may include but is not limited to the total kWh usage, the Time-Of-Use (TOU) kWh usage, peak kW demand, interval data, and other energy consumption measurements and status information. Gatekeeper 116 also may receive and store previous billing and previous season data from meters 114 and store the data in memory 212 or the database in gatekeeper 116. The database may be implemented as one or more tables of data within the gatekeeper 116.

In an embodiment, the metering system 110 may be an Advanced Metering Infrastructure (AMI) system which uses the ANSI C12.22 protocol for communications among meter devices 114/116 and the head-end system 206. Other protocols, however, could be employed.

As is apparent from the embodiments described herein, all or portions of the mechanisms, methods, and aspects disclosed herein may be embodied in the form of computer executable instructions (i.e., program code) stored on a computer-readable storage medium (e.g., memory 212' of meter 114), which instructions, when executed by a processor (e.g., processor 205' of meter 114), perform and/or implement the methods, mechanisms and aspects described herein. Computer readable storage media include both volatile and nonvolatile, removable and non-removable media implemented in any method or technology for storage of information. Computer readable storage media include, but are not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by a computer. These storage media may be integrated into a processor or may be separate components within a device. As used herein, the term "computer readable storage media" or the like does not include signals.

Figure 3:
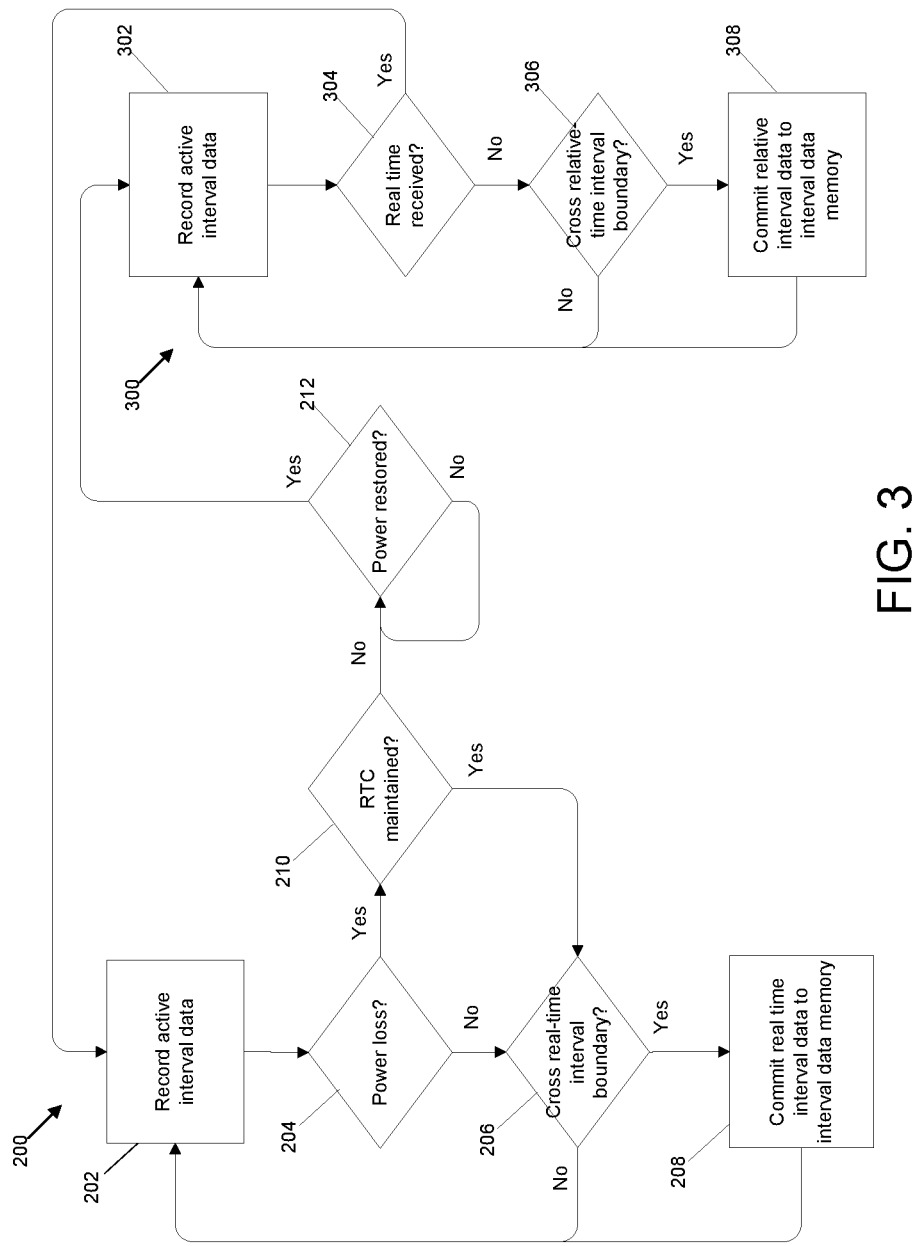
FIG. 3 is a flowchart illustrating one embodiment of a method to record interval data, according to an aspect of the disclosure.
Figure 4:
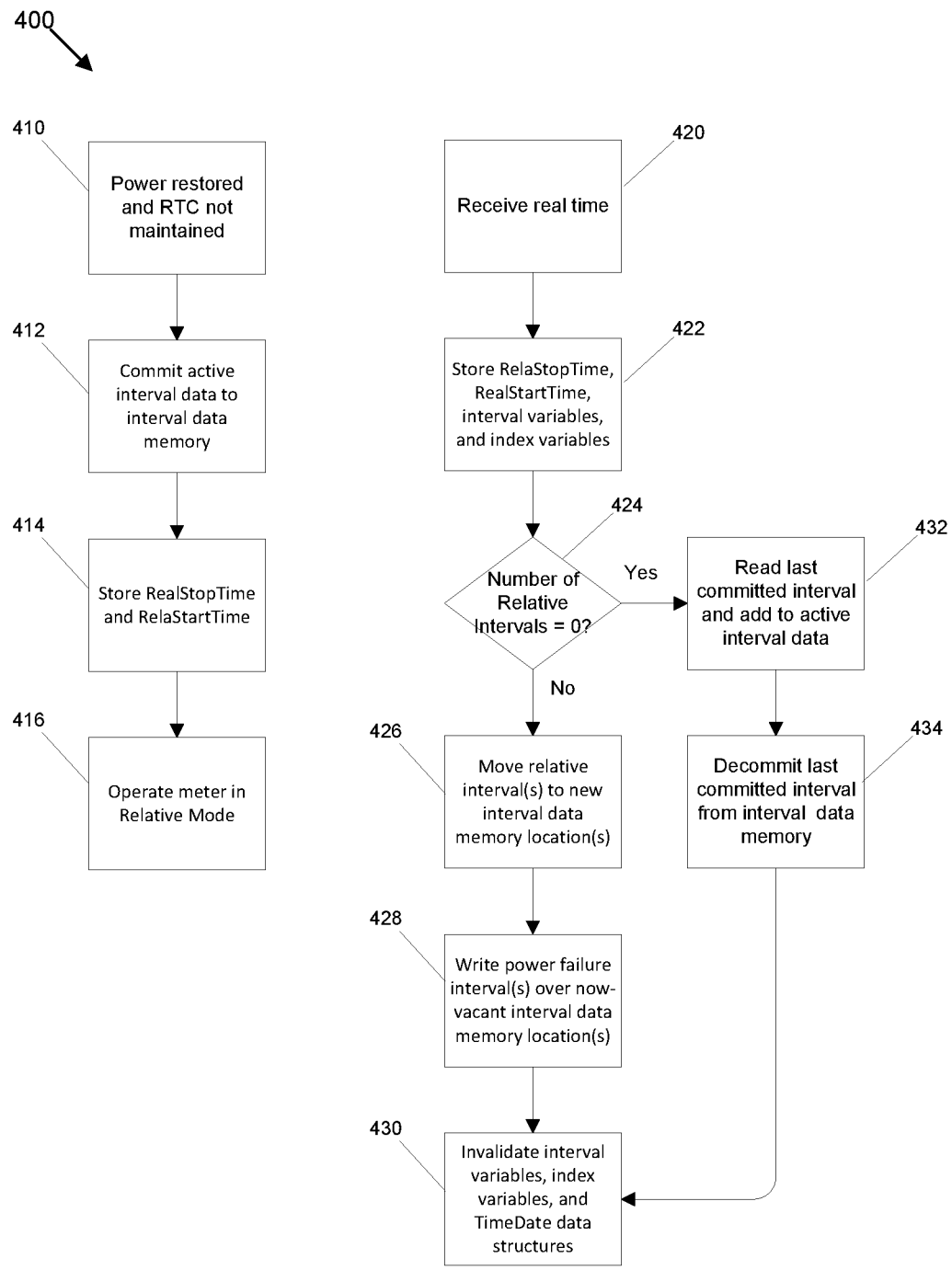
FIG. 4 is a flowchart illustrating an embodiment of a method to synchronize relative interval data into real-time intervals, according to an aspect of the disclosure.
Figure 5:
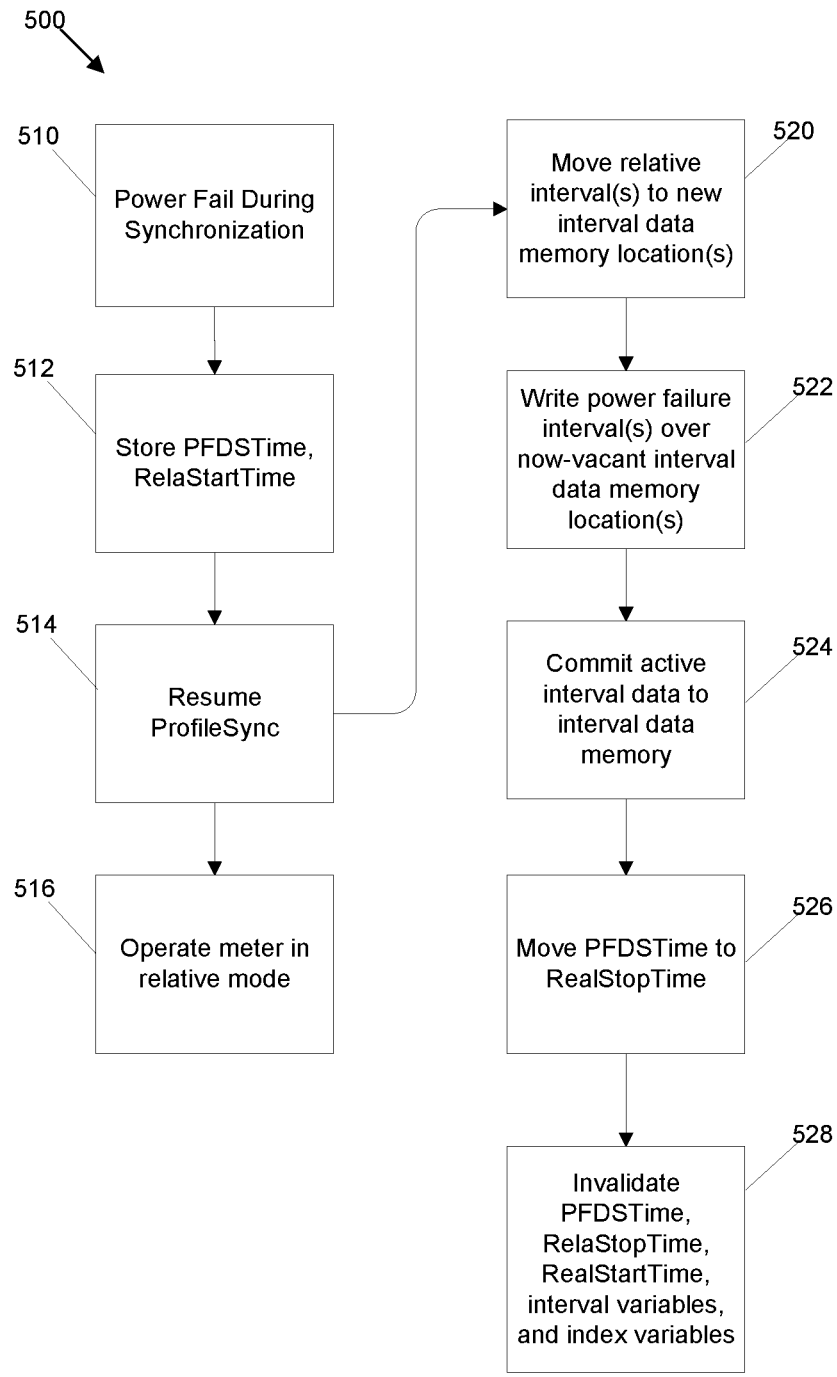
FIG. 5 is a flowchart illustrating another embodiment of a method to synchronize relative interval data into real-time intervals, according to an aspect of the disclosure.

FIGS. 3-5 illustrate exemplary embodiments of mechanisms to record real time interval data when a meter loses real time due to a power failure, and embodiments of methods to synchronize that "relative" interval data into real time intervals, when the mechanism receives notification of the real time. As noted above, each interval typically is aligned to a real-time clock boundary (e.g., 00:15:00, 00:30:00). The mechanisms and methods may be performed by a meter in the metering system 110, such as meter 114 shown in FIG. 2B, which includes metering circuitry 204', meter processor 205', meter memory 212' and clock circuitry 203', also referred to as a real-time clock (RTC).

In the exemplary embodiments disclosed below, the meter is sensing 1 watt-second of usage any time it is powered on. That usage and the corresponding time and date information for the usage is recorded at a high resolution (e.g., 500 ms) as active interval data and committed to active interval memory. In addition, the meter is using 15 minute intervals. When an interval boundary is crossed, the meter commits the accumulated active interval data into interval memory (e.g., commits interval data to memory every 15 minutes). As such, a meter in the examples below would sense a total of 900 watt-seconds usage for one complete 15 minute interval. The active interval memory and interval data memory may be any type of non-volatile memory configuration. In one embodiment, the active interval memory is non-volatile memory configured for high resolution write operations (e.g., NVRAM), which may avoid problems related to wearout in other types of non-volatile memory (e.g., EEPROM, Flash).

The following key is used to describe the interval data.

| Interval Type | Description |
|---|---|
| A | Intervals where no relative time or power outages occurred |
| B | Intervals where power failure occurred |
| C | Intervals where power failed and time was maintained and therefore synchronized on restoration |
| D | Intervals where power failed and were filled in upon reception of time |
| E | Intervals where an interval boundary was crossed but time was unknown (relative time intervals) |
| F | Intervals where an interval boundary was crossed but time was unknown (relative time intervals) and power failed during the interval |
| G | Intervals that include some amount of relative time as well as real time due to time reception and are thus marked as relative |

In addition, the exemplary intervals contain the following information indicators:

Interval: Description of interval data as indicated in Table A.

End Time: The end-of-interval time. For example, the interval from 12:45:00 to 13:00:00 is marked as 13:00:00. The End Time is designated "Unfinished" when accumulated interval data is shown, but the interval boundary has not been crossed (i.e., represents accumulated active interval data that has not been committed to interval data memory).

Flags: Flags associated with the individual interval, as described below:

Normal: Real time was known throughout the entire interval.

Relative: Real time was unknown for part of the interval and therefore actual boundaries may not align exactly to real time. As such, these intervals are considered estimated.

PF: A power failure occurred during the interval.

Usage: The amount of energy metered during the interval (shown in watt-seconds for convenience of the reader).

Memory: The index at which the interval data is stored in the interval data memory, or "Active" to indicate the accumulated active interval data in the active interval memory.

FIG. 3 illustrates an embodiment of a process 200 to record real-time interval data when the meter is operating in real time. In addition, FIG. 3 illustrates an embodiment of a process 300 to record relative interval data when the meter loses real time and is operating in relative time.

At step 202, the meter records active interval data and commits the accumulated real-time interval data to interval data memory at step 208, only when the meter crosses a real time interval boundary at step 206. If there is a power failure at step 204, and the RTC is maintained at 210, the meter continues to commit real-time interval data to interval data memory at step 208, when the meter crosses a real-time interval boundary at step 206. Since the meter did not lose real time, the power outage duration is captured in the meter's interval data memory. In such a scenario, the meter operated in "Real-Time Mode."

If a power failure occurs at step 204, and the RTC loses real time at step 210, the meter will stay at step 212 for the duration of the power outage until power is restored. When power is restored at step 212, the meter initially performs synchronization steps, discussed in detail below, and then begins accumulating relative interval data. The meter is now operating in Relative Mode.

While in Relative Mode, the meter records active interval data at step 302, and commits the accumulated relative interval data to interval data memory at step 308, only when the meter crosses a relative time interval boundary at step 306. The meter will continue to commit relative interval data at every relative time interval boundary until the meter receives the real time at step 312. When the meter receives real time, in one embodiment described herein, it triggers mechanisms and methods referred to herein as ProfileSync mechanisms and methods, and then returns to operating in Real-Time Mode at step 202. The following example highlights the differences between a meter operating in Real-Time Mode and Relative Mode, then introduces the ProfileSync mechanisms and methods.

Example 1

Beginning with a meter that has real time and is accumulating active interval data, the meter experiences a power outage occurring at 1:25:35. For a power outage duration of 38 minutes (m) and 31 seconds (s) (i.e., power resumes at 2:04:06), where real time is retained during the outage, the interval data memory is structured as shown:

TABLE 1

Normal Interval Data Accumulation Through a Short Duration Power Outage

| Interval | End Time | Flags | Usage | Memory |
|---|---|---|---|---|
| A | 1:00:00 | Normal | 900 | Index 0 |
| A | 1:15:00 | Normal | 900 | Index 1 |
| B | 1:30:00 | PF | 635 | Index 2 |
| C | 1:45:00 | PF | 0 | Index 3 |
| C | 2:00:00 | PF | 0 | Index 4 |
| C | 2:15:00 | Normal | 654 | Index 5 |
| A | 2:30:00 | Normal | 900 | Index 6 |
| A | 2:45:00 | Normal | 900 | Index 7 |
| A | 3:00:00 | Normal | 900 | Index 8 |

If real time had been lost during the outage depicted in Table 1, due to battery or capacitor depletion, then when power is restored, the interval data collection must resume at midnight Jan. 1, 2000 (relative) as shown in Table 2. Assuming real time was received at 2:38:38, the meter would have accumulated 34 m 32 s of relative data. Note that the interval in Index 5 has not completed and reflects 4 m 32 s worth of accumulated active interval data.

TABLE 2

Interval Data Accumulation on Relative Time

| Interval | End Time | Flags | Usage | Memory |
|---|---|---|---|---|
| A | 1:00:00 | Normal | 900 | Index 0 |
| A | 1:15:00 | Normal | 900 | Index 1 |
| B | 1:30:00 | PF | 635 | Index 2 |

TABLE 2-continued

Interval Data Accumulation on Relative Time

| Interval | End Time | Flags | Usage | Memory |
|---|---|---|---|---|
| E | 0:15:00 | Relative | 900 | Index 3 |
| E | 0:30:00 | Relative | 900 | Index 4 |
| G | 00:45:00 (unfinished) | Relative | 272 | Active |

Ultimately, the relative intervals that were metered after restoration need to be synchronized to the approximate real-time intervals when the energy usage was recorded. After synchronization, the interval data memory would be as shown in Table 3:

TABLE 3

Interval Data After Relative Time Synchronization

| Interval | End Time | Flags | Usage | Memory |
|---|---|---|---|---|
| A | 1:00:00 | Normal | 900 | Index 0 |
| A | 1:15:00 | Normal | 900 | Index 1 |
| B | 1:30:00 | PF | 635 | Index 2 |
| D | 1:45:00 | PF | 0 | Index 3 |
| D | 2:00:00 | PF | 0 | Index 4 |
| E | 2:15:00 | Relative | 900 | Index 5 |
| E | 2:30:00 | Relative | 900 | Index 6 |
| G | 2:45:00 | Relative | 654 | Index 7 |
| A | 3:00:00 | Normal | 900 | Index 8 |

Analyzing and reformatting interval data as shown in Table 3 has multiple benefits. Most importantly, the usage quantities for both Table 1 and Table 3 have identical summations, which ensures that all energy is accounted for while the meter is online. As such, there is no period of time when energy is measured outside of an interval. In addition, the reader of the data can now account for all intervals of the day (e.g., a day with 15-minute intervals will always have 96 values). The metered usage is closer to the real time interval boundaries in which the usage occurred—the relative interval data accuracy is within one interval time span of the real interval of measure. Finally, storage space is saved by committing intervals only when a boundary is known to have been crossed.

FIGS. 4-5 illustrate embodiments of the ProfileSync mechanisms and methods. As disclosed herein, mechanisms are provided for determining the correct non-volatile memory index for the accumulated relative intervals and then moving them to the correct real-time interval data memory location. Mechanisms and methods are also provided for determining in which intervals a power failure occurred and writing those intervals to the correct real-time interval data memory locations. These mechanisms are power fail tolerant during both the analysis and synchronization.

In one embodiment, synchronization is governed by the following variables and definitions:
  ProfileSync: The state machine governing the synchronization of relative intervals into the correct real time interval data memory location.
  TimeDate: A data structure containing a time and date. The TimeDate data structures described below are stored to non-volatile memory.
  RealStopTime: The TimeDate containing the time and date of the power failure resulting in time lost. The time and date of the power failure may be determined from the active interval data.

RealStartTime: The TimeDate containing the time and date the meter received notification of the real time.

RelaStartTime: The TimeDate containing the time and date that relative time begins (i.e., midnight on Jan. 1, 2000). Also functions as an accumulator to store the durations of power failures (where time is maintained) that occur during a ProfileSync.

RelaStopTime: The TimeDate containing the total accumulation of relative time.
   Also functions as an accumulator to store relative time that occurs during a ProfileSync due to a power failure during ProfileSync.

PFDSTime: The TimeDate containing the time of any power failure that occurred during the ProfileSync (Power Fail During Sync).

Referring to FIG. 4, after a power failure during which the real-time clock was not maintained, when power is restored at step 410, the accumulated active interval data that was being recorded when the power failure occurred is written to the interval data memory at step 412. The meter is now operating in Relative Mode. At step 414, the time and date of the outage is stored to non-volatile memory in a TimeDate data structure called RealStopTime. In addition, relative time begins at midnight on Jan. 1, 2000 and is stored to non-volatile memory in a TimeDate structure called RelaStartTime.

While in Relative Mode, the meter continues to commit relative interval data at every relative time interval boundary (e.g., every 15 minutes), as shown in FIG. 3 steps 302, 306, and 308. The meter eventually receives a time and date notification at step 304, either through a network or optical port communication, for example. The time and date notification includes the time (e.g., may be expressed as seconds into the day, hours/minutes/seconds, 24 or 12 hour clock), date (e.g., may be expressed as month/day/year, or day of year) and daylight savings time (DST) status. ProfileSync adjusts the amount of actual time elapsed if DST changes in either direction during the outage.

Turning to FIG. 4, ProfileSync receives a value indicative of real time at step 420. In the present embodiment, the real time value is received as a TimeDate structure. At step 422, the accumulated relative time is stored to non-volatile memory in a TimeDate structure as RelaStopTime and the received real-time TimeDate is stored to non-volatile memory as Real StartTime.

The knowledge of these four TimeDate data structures allows for the allocation of accumulated relative interval data into the appropriate real-time interval data memory locations by calculating and using the following interval and index variables:

nbrTotalInts: The number of total real-time interval boundaries crossed between RealStopTime and RealStartTime, subtracting the interval immediately committed on restoration.

nbrRelativeInts: The number of relative intervals committed to interval data memory between RelaStartTime to RelaStopTime.

nbrPowerFailInts: The number of intervals, including the initial interval, where power failed (nbrPowerFailInts=nbrTotalInts−nbrRelativeInts).

pfIntIdx: Memory index of the interval when the power failure occurred.

relaDestIdx: The final destination memory index in interval data memory for relative intervals marked from the most recent interval (relaDestIdx=pfIntIdx+nbrPowerFailInts+nbrRelativeInts).

pfDestIdx: The memory index at which the power outage ended and relative time began (pfDestIdx=pfIntIdx+brPowerFailInts).

Continuing with FIG. 4, in one embodiment, the ProfileSync process is initiated at step 420 by providing a TimeDate with the real time to the meter that is operating in relative time. At step 422, the accumulated relative time is stored to non-volatile memory in a TimeDate as RelaStopTime and the received real-time TimeDate is stored to non-volatile memory as RealStartTime. The number of relative intervals committed to interval data memory that have accumulated after the power restoration must be moved ahead in the interval data memory by the number of intervals where power failed in order to account for the duration of the power outage. ProfileSync transitions the interval data memory layout illustrated in Table 2 to the interval data memory layout illustrated in Table 3 via the following method:

1. At step 422, calculate interval variables (nbrTotalInts, nbrRelativeInts, and nbrPowerFailInts) and index variables (relaDestIdx and pfDestIdx) indicated above and store to non-volatile memory along with the TimeDate data structures (RealStopTime, RealStartTime, RelaStartTime, RelaStopTime, and PFDSTime);
2. At step 426, move relative intervals to new interval data memory locations from newest to oldest (highest index to lowest index);
3. At step 428, write power failure interval(s) over the now-vacant interval data memory location(s) between the new relative interval index and the last real interval index; and
4. At step 430, invalidate the interval variables, index variables, and TimeDate data structures from non-volatile memory, thereby preventing another synchronization of the same data.

Example 2

A meter that has real-time and is accumulating active interval data experiences a power outage at 18:39:31 on 7/15/2014 (i.e., FIG. 3, step 204). Power is restored, but time was lost during the outage (i.e., FIG. 3, step 212). The pre-power fail accumulated active interval data is committed to interval data memory (i.e., FIG. 4, step 412) (shown as Index 2 in Table 4 below) and relative intervals begin accumulating. Real time is received at 19:47:21 on 7/15/2014 (i.e, FIG. 3, step 304 and FIG. 4, step 420). When the real time is received, the relative time is at 00:37:31 01/01/2000 (37 m 31 s of relative time has accumulated).

TABLE 4

Interval Data Layout before ProfileSync

| Interval | End Time | Flags | Usage | Memory |
| --- | --- | --- | --- | --- |
| A | 18:15:00 | Normal | 900 | Index 0 |
| A | 18:30:00 | Normal | 900 | Index 1 |
| B | 18:45:00 | PF | 571 | Index 2 |
| E | 0:15:00 | Relative | 900 | Index 3 |
| E | 0:30:00 | Relative | 900 | Index 4 |
| G | 20:00:00 (unfinished) | Relative | 451 | Active |

Turning to FIG. 4, at step 422, ProfileSync calculates:

*nbr*TotalInts=number of real-time interval boundaries crossed between RealStopTime (18:39:31) and RealStartTime (19:47:21)=5 (18:45:00, 19:00:00, 19:15:00, 19:30:00, and 19:45:00)−1=4 nbrRelativeInts=number of relative intervals committed to memory between RelaStartTime (00:00:00) and RelaStopTime (00:37:31)=2 (00:15:00 and 00:30:00).

nbrPowerFailInts=nbrTotalInts−nbrRelativeInts=(4−2)=2 relaDestIdx=(pfIntIndex+nbrPowerFailInts+nbrRelativeInts)=(2+2+2)=6 pfDestIdx=(pfIntIndex+nbrPowerFailInts)=(2+2)=4

ProfileSync Operation:

At step 426, From the current location in the interval data memory, the number of complete relative intervals (nbrRelativeInts=2) are moved ahead by the number of power fail intervals (nbrPowerFailInts=2) in newest to oldest order (highest index to lowest index: e.g., Index4→Index6, Index3→Index5). At step 428, from the power fail interval data memory location (pfIntIdx=2), the number of power fail intervals (nbrPowerFailInts=2) are zeroed and marked as power failed. At step 430, ProfileSync then invalidates the interval variables, index variables, and TimeDate data structures from non-volatile memory in preparation for the next synchronization. Upon completion of ProfileSync, the interval data memory is as shown in Table 5:

TABLE 5

Interval Data Layout after ProfileSync

| Interval | End Time | Flags | Usage | Memory |
|----------|----------|-------|-------|--------|
| A | 18:15:00 | Normal | 900 | Index 0 |
| A | 18:30:00 | Normal | 900 | Index 1 |
| B | 18:45:00 | PF | 571 | Index 2 |
| D | 19:00:00 | PF | 0 | Index 3 |
| D | 19:15:00 | PF | 0 | Index 4 |
| E | 19:30:00 | Relative | 900 | Index 5 |
| E | 19:45:00 | Relative | 900 | Index 6 |
| G | 20:00:00 | Relative | 451 | Active |
|   | (unfinished) |   |   |   |

While time is relative, the meter does not know where real-time interval boundaries are. The intervals are instead closed on relative time boundaries. In this example, the meter accumulated 37 m 31 s of relative time. As such, the meter crossed 2 relative interval boundaries (00:15:00 and 00:30:00) while in relative time. Although the process may not allocate the usage to the exact real-time intervals in which the consumption occurred, the total energy consumption is still correct. In the example, the meter is sensing 1 watt-second of usage any time it is powered on. The 00:37:31 yields 2251 usage across the relative time. When real time was restored, the meter is 00:07:31 into the current relative interval. The RealStartTime was 19:47:21, which means the meter needs to wait 12 m 39 s until the 20:00:00 interval to commit the usage to interval data memory. Thus, the restoration interval will have the combined 00:07:31 usage of the current relative interval as well as the 00:12:39 usage remaining in the current real time interval. That yields 1210 total usage for the restoration interval (Index 7 in Table 6). Upon completion of the next real time interval (e.g., 20:15:00), the interval data memory is as shown in Table 6:

TABLE 6

Interval Data Layout after ProfileSync and Interval Completion

| Interval | End Time | Flags | Usage | Memory |
|----------|----------|-------|-------|--------|
| A | 18:15:00 | Normal | 900 | Index 0 |
| A | 18:30:00 | Normal | 900 | Index 1 |
| B | 18:45:00 | PF | 571 | Index 2 |
| D | 19:00:00 | PF | 0 | Index 3 |
| D | 19:15:00 | PF | 0 | Index 4 |
| E | 19:30:00 | Relative | 900 | Index 5 |
| E | 19:45:00 | Relative | 900 | Index 6 |
| G | 20:00:00 | Relative | 1210 | Index 7 |
| A | 20:15:00 | Normal | 900 | Index 8 |

Recognize that a situation may be encountered where the real time is received within the same interval when the real time was lost. For example, this could occur due to a faulty (or non-existent) storage capacitor or battery. In this case, the interval that is committed to interval data memory on power restoration must be decommitted and then added to the relative interval that is currently active. Because time has been completely accounted for in this interval, only the PF status flag is set, the relative status flag is cleared and the interval data is committed to interval data memory at the crossing of the next real-time interval boundary.

Example 3

A meter that has real time and is accumulating active interval data experiences a power outage at 18:39:31 on 7/15/2014 (i.e., FIG. 3, step 204). Power is restored, but time was lost during the outage (i.e., FIG. 3, step 212). So the pre-power fail accumulated active interval data is committed to interval data memory (i.e., FIG. 4, step 412) (shown as Index 2 in Table 7 below) and relative intervals begin accumulating. Real time is received at 18:43:21 on 7/15/2014 (i.e, FIG. 3, step 304 and FIG. 4, step 420). When the real time is received, the relative time is at 00:1:21 01/01/2000 (1 m 21 s of relative time has accumulated) (i.e., power resumed at 18:42:00).

TABLE 7

Interval Data Layout before a Same Interval ProfileSync

| Interval | End Time | Flags | Usage | Memory |
|----------|----------|-------|-------|--------|
| A | 18:15:00 | Normal | 900 | Index 0 |
| A | 18:30:00 | Normal | 900 | Index 1 |
| B | 18:45:00 | PF | 571 | Index 2 |
| E | 00:15:00 | Relative | 81 | Active |
|   | (unfinished) |   |   |   |

Turning to FIG. 4, at step 422, ProfileSync calculates:

nbrTotalInts=number of real-time interval boundaries crossed between RealStopTime (18:39:31) and RealStartTime (18:43:21)=0 nbrRelativeInts=number of relative intervals committed to memory between RelaStartTime (00:00:00) and RelaStopTime (00:01:31)=0 nbrPowerFailInts=nbrTotalInts−nbrRelativeInts=0

ProfileSync Operation:

At step 424, there is no need to move relative intervals because none have been committed to interval data memory. Because there are zero power fail intervals, at step 432, the last committed interval (Index 2 in Table 7) is read back into the active interval memory and added into the currently accumulating interval usage. At step 434, the last committed interval is decommitted, and ProfileSync then invalidates the interval variables, index variables, and at step 430, TimeDate data structures from non-volatile memory in preparation for the next synchronization. Upon completion of ProfileSync, the interval data memory is as shown in Table 8:

TABLE 8

Interval Data Layout after a Same Interval ProfileSync

| Interval | End Time | Flags | Usage | Memory |
|---|---|---|---|---|
| A | 18:15:00 | Normal | 900 | Index 0 |
| A | 18:30:00 | Normal | 900 | Index 1 |
| C | 18:45:00 (unfinished) | PF | 652 | Active |

The accumulating active interval data is committed to interval data memory when time crosses a real-time interval boundary 00:01:39 later–18:45:00 (i.e., FIG. 3, step 208). There is no loss of information, none of the intervals are marked as estimated and the interval data memory has the layout shown in Table 9:

TABLE 9

Interval Data Layout after a Same Interval ProfileSync and Interval Completion

| Interval | End Time | Flags | Usage | Memory |
|---|---|---|---|---|
| A | 18:15:00 | Normal | 900 | Index 0 |
| A | 18:30:00 | Normal | 900 | Index 1 |
| C | 18:45:00 | PF | 751 | Index 2 |

Recognize that another situation may be encountered where a power fail in which time is lost occurs during synchronization. If this occurs, ProfileSync completely finishes the current synchronization operation before performing the operations necessary to prepare for the next synchronization.

Example 4

A meter that has real time and is accumulating active interval data experiences a power outage at 18:39:31 on 7/15/2014. Power is restored, but time was lost during the outage (i.e., FIG. 3, step 204). The pre-power fail accumulated active interval data is committed to interval data memory (i.e., FIG. 4, step 412) and relative intervals begin accumulating. Real time is received at 19:47:21 on 7/15/2014 (i.e, FIG. 3, step 304 and FIG. 4, step 420). When the real time is received, the relative time is at 00:37:31 01/01/2000 (37 m 31 s of relative time has accumulated).

Turning to FIG. 4, at step 422, ProfileSync calculates:

$nbr$TotalInts=number of real-time interval boundaries crossed between RealStopTime (18:39:31) and RealStartTime (19:47:21)=5 (18:45:00, 19:00:00, 19:15:00, 19:30:00, and 19:45:00)−1=4

$nbr$RelativeInts=number of relative intervals committed to interval data memory between RelaStartTime (00:00:00) and RelaStopTime (00:37:31)=2 (00:15:00 and 00:30:00).

$nbr$PowerFailInts=$nbr$TotalInts−$nbr$RelativeInts=(4−2)=2 relaDestIdx=(pfIntIndex+$nbr$PowerFailInts+$nbr$RelativeInts)=(2+2+2)=6 pfDestIdx=(pfIntIndex+$nbr$PowerFailInts)=(2+2)=4

ProfileSync Pperation:

At step 426, the ProfileSync operation begins moving the first of the two relative intervals (Index 4→Index 6). A second power failure occurs at 19:47:23−2 seconds into ProfileSync—and time is lost during the outage. Referring to FIG. 5 at step 512, upon restoration, the second power fail time is committed to the PFDSTime TimeDate. At restoration, interval data memory has the layout shown in Table 10 (note that an additional 2 s of usage is included as part of the active interval data):

TABLE 10

A ProfileSync Interrupted By Power Failure

| Interval | End Time | Flags | Usage | Memory |
|---|---|---|---|---|
| A | 18:15:00 | Normal | 900 | Index 0 |
| A | 18:30:00 | Normal | 900 | Index 1 |
| B | 18:45:00 | PF | 571 | Index 2 |
| E | 0:15:00 | Relative | 900 | Index 3 |
| E | 0:30:00 | Relative(1) | 900 | Index 4 |
| E | N/A | Vacant | N/A | Index 5 |
| E | 19:45:00 | Relative(1) | 900 | Index 6 |
| G | 20:00:00 (unfinished) | Relative | 453 | Active |

Because all synchronization related values are written to non-volatile memory, the synchronization can resume exactly where it left off and complete. At step 514, the ProfileSync resumes. At step 520, the remaining relative interval is moved (Index 3→Index 5), and at step 522 the two power fail intervals (Index 3 and 4) are written. In this fashion, a synchronization can be resumed upon restoration from any outage that occurs during a ProfileSync. The completion of this synchronization operation occurs before any new interval data is committed to interval data memory and this operation will complete before any new synchronization (due to multiple outages) can occur. ProfileSync is, therefore, power fail tolerant both during the analysis and synchronization.

After synchronization, the active interval data that had been accumulating during the ProfileSync (i.e., the current interval) is committed to interval data memory at step 524. At step 526, in preparation for the next synchronization, ProfileSync moves PFDSTime to the RealStopTime data structure and invalidates the interval variables, index variables, PFDSTime, RelaStopTime, and RealStartTime data structures from non-volatile memory at step 528. The interval data memory then has the layout shown in Table 11:

TABLE 11

A ProfileSync Completed After A Power Failure

| Interval | End Time | Flags | Usage | Memory |
|---|---|---|---|---|
| A | 18:15:00 | Normal | 900 | Index 0 |
| A | 18:30:00 | Normal | 900 | Index 1 |
| B | 18:45:00 | PF | 571 | Index 2 |
| D | 19:00:00 | PF | 0 | Index 3 |
| D | 19:15:00 | PF | 0 | Index 4 |
| E | 19:30:00 | Relative | 900 | Index 5 |
| E | 19:45:00 | Relative | 900 | Index 6 |

TABLE 11-continued

A ProfileSync Completed After A Power Failure

| Interval | End Time | Flags | Usage | Memory |
|---|---|---|---|---|
| F | 20:00:00 | Relative/PF | 453 | Index 7 |

Upon reception of real time, synchronization is started and any intervals accumulated during the second relative period are synchronized. For this example, real time is received at 20:57:21 on 7/15/2014. When that real time is received, the relative time is at 00:27:31 01/01/2000 (27 m 31 s of relative time has accumulated during the second relative period). The interval data memory has the following layout:

TABLE 12

A ProfileSync Ready to Recover From a Power Fail During Sync

| Interval | End Time | Flags | Usage | Memory |
|---|---|---|---|---|
| A | 18:15:00 | Normal | 900 | Index 0 |
| A | 18:30:00 | Normal | 900 | Index 1 |
| B | 18:45:00 | PF | 571 | Index 2 |
| D | 19:00:00 | PF | 0 | Index 3 |
| D | 19:15:00 | PF | 0 | Index 4 |
| E | 19:30:00 | Relative | 900 | Index 5 |
| E | 19:45:00 | Relative | 900 | Index 6 |
| F | 20:00:00 | Relative/PF | 453 | Index 7 |
| E | 0:15:00 | Relative | 900 | Index 8 |
| G | 21:00:00 (unfinished) | Relative | 751 | Active |

ProfileSync Calculates:

*nbr*TotalInts=number of real-time interval boundaries crossed between RealStopTime (19:47:23) and RealStartTime (20:57:21)=4 (20:00:00, 20:15:00, 20:30:00, and 20:45:00)−1=3

*nbr*RelativeInts=number of relative intervals committed to memory between RelaStartTime (00:00:00) and RelaStopTime (00:27:31)=1 (00:15:00)

*nbr*PowerFailInts=*nbr*TotalInts−*nbr*RelativeInts=(3−1)=2 relaDestIdx=(pfIntIndex+*nbr*PowerFailInts+*nbr*RelativeInts)=(7+2+1)=10

*pf*DestIdx=(*pf*IntIndex+*nbr*PowerFailInts)=(7+2)=9

ProfileSync Operation:

From the current location in memory, the number of complete relative intervals (nbrRelativeInts=1) are moved ahead by the number of power fail intervals (nbrPowerFailInts=2) (e.g., Index 8→Index 10). From the power fail interval memory location (pfIntIdx=7), the number of power fail intervals (nbrPowerFailInts=2) are zeroed and marked as power failed. ProfileSync then invalidates the interval variables, index variables, and TimeDate data structures from non-volatile memory in preparation for the next synchronization. The interval data memory has the layout shown in Table 13:

TABLE 13

A ProfileSync After Recovery From a Power Fail During Sync

| Interval | End Time | Flags | Usage | Memory |
|---|---|---|---|---|
| A | 18:15:00 | Normal | 900 | Index 0 |
| A | 18:30:00 | Normal | 900 | Index 1 |
| B | 18:45:00 | PF | 571 | Index 2 |
| D | 19:00:00 | PF | 0 | Index 3 |
| D | 19:15:00 | PF | 0 | Index 4 |
| E | 19:30:00 | Relative | 900 | Index 5 |
| E | 19:45:00 | Relative | 900 | Index 6 |
| F | 20:00:00 | Relative/PF | 453 | Index 7 |
| D | 20:15:00 | PF | 0 | Index 8 |
| D | 20:30:00 | PF | 0 | Index 9 |
| E | 20:45:00 | Relative | 900 | Index 10 |
| G | 21:00:00 (unfinished) | Relative | 751 | Active |

After completion of the next real-time interval, the interval data memory has the layout shown in Table 14:

TABLE 14 final memory layout with a completed normal interval after a ProfileSync and after Recovery From a Power Fail During Sync

| Interval | End Time | Flags | Usage | Memory |
|---|---|---|---|---|
| A | 18:15:00 | Normal | 900 | Index 0 |
| A | 18:30:00 | Normal | 900 | Index 1 |
| B | 18:45:00 | PF | 571 | Index 2 |
| D | 19:00:00 | PF | 0 | Index 3 |
| D | 19:15:00 | PF | 0 | Index 4 |
| E | 19:30:00 | Relative | 900 | Index 5 |
| E | 19:45:00 | Relative | 900 | Index 6 |
| F | 20:00:00 | Relative/PF | 453 | Index 7 |
| D | 20:15:00 | PF | 0 | Index 8 |
| D | 20:30:00 | PF | 0 | Index 9 |
| E | 20:45:00 | Relative | 900 | Index 10 |
| G | 21:00:00 | Relative | 910 | Index 11 |
| A | 21:15:10 | Normal | 900 | Index 12 |

While example embodiments and advantages have been described above, modifications and variations may be made without departing from the principles described above and set forth in the following claims. Accordingly, reference should be made to the following claims as describing the scope of the present invention.

What is claimed:

1. A method comprising: having a meter that measures consumption of electricity and includes a real-time clock to maintain a measure of real time;
    receiving a real-time clock value reflecting said measure of real time;
    measuring energy consumption during successive real time intervals, each real time interval being aligned to a real-time clock boundary;
    for each real time interval, storing data indicative of the measured energy consumption in a respective memory location representing that real time interval;
    in response to a power outage that results in the loss of the measure of real time, establishing a relative start time;

measuring energy consumption during successive relative time intervals following restoration of power, each relative time interval being measured relative to the relative start time;

for each relative time interval, storing data indicative of the measured energy consumption in a respective memory location representing that relative time interval; and upon receiving an updated real time clock value reflecting the measure of real time, synchronizing the relative time interval data stored after restoration of power with the real time interval data stored prior to the power outage, by determining, based on the received updated real time clock value, a number of relative time intervals stored in memory and a number of power failure intervals, and by moving the data stored in the memory locations representing the number of relative time intervals ahead in memory by the number of power fail intervals to memory locations representing real time intervals, thereby storing the data indicative of energy consumption measured during relative time intervals in the memory locations representing real time intervals that are closer to the real time when the energy consumption occurred.

2. The method of claim 1, wherein each relative time interval is aligned to a real-time clock boundary.

3. The method of claim 2, wherein each relative time interval is equal to the duration of each real time interval.

4. The method of claim 1, wherein synchronizing further comprises determining a real time when the power outage occurred.

5. The method of claim 1, wherein synchronizing further comprises moving the number of relative time intervals stored in memory ahead in memory in order from a newest relative time interval to an oldest relative time.

6. The method of claim 5, wherein synchronizing further comprises zeroing data in respective memory locations for the power failure intervals.

7. The method of claim 1, wherein synchronization is power fail tolerant.

8. A metering device wherein said metering device comprises a real-time clock to maintain a measure of time, a processor and a memory, the memory containing computer executable instructions that, when executed by the processor, cause the metering device to:

receive a real-time clock value reflecting a measure of real time;

measure energy consumption during successive real time intervals, each real time interval being aligned to a real-time clock boundary;

store data indicative of the measured energy consumption in a respective memory location representing that real time interval;

establish a relative start time in response to a power outage that results in the loss the measure of real time;

measure energy consumption during successive relative time intervals following restoration of power, each relative time interval being measured relative to the relative start time;

store data indicative of the measured energy consumption in a respective memory location representing that relative time interval; and upon receiving an updated real time clock value reflecting the measure of real time, synchronizing the relative time interval data stored after restoration of power with the real time interval data stored prior to the power outage, by determining, based on the received updated real time clock value, a number of relative time intervals stored in memory and a number of power failure intervals, and by moving the data stored in the memory locations representing the number of relative time intervals ahead in memory by the number of power fail intervals to memory locations representing real time intervals, thereby storing the data indicative of energy consumption measured during relative time intervals in the memory locations representing real time intervals that are closer to the real time when the energy consumption occurred.

9. The metering device of claim 8, wherein each relative time interval is aligned to a real-time clock boundary.

10. The metering device of claim 9, wherein each relative time interval is equal to the duration of each real time interval.

11. The metering device of claim 8, wherein synchronization further comprises determining a real time when the power outage occurred.

12. The metering device of claim 8, wherein synchronizing further comprises moving the number of relative time intervals stored in memory ahead in memory in order from a newest relative time interval to an oldest relative time interval.

13. The metering device of claim 12, wherein synchronization further comprises zeroing data in respective memory locations for the power failure intervals.

14. The metering device of claim 8, wherein synchronization is power fail tolerant.

15. A computer-readable storage medium storing computer-executable instructions that, when executed by a processor of a metering device having a real-time clock to maintain a measure of time, cause the metering device to:

receive a real-time clock value reflecting a measure of real time;

measure energy consumption during successive real time intervals, each real time interval being aligned to a real-time clock boundary;

store data indicative of the measured energy consumption in a respective memory location representing that real time interval;

establish a relative start time in response to a power outage that results in the loss the measure of real time;

measure energy consumption during successive relative time intervals following restoration of power, each relative time interval being measured relative to the relative start time;

store data indicative of the measured energy consumption in a respective memory location representing that relative time interval;

upon receiving an updated real time clock value reflecting the measure of real time, synchronizing the relative time interval data stored after restoration of power with the real time interval data stored prior to the power outage, by determining, based on the received updated real time clock value, a number of relative time intervals stored in memory and a number of power failure intervals, and by moving the data stored in the memory locations representing the number of relative time intervals ahead in memory by the number of power fail intervals to memory locations representing real time intervals, thereby storing the data indicative of energy consumption measured during relative time intervals in the memory locations representing real time intervals that are closer to the real time when the energy consumption occurred; and transmitting the data representing the real time intervals to a data collection server.

16. The computer-readable storage medium of claim 15, wherein each relative time interval is aligned to a real-time clock boundary.

17. The computer-readable storage medium of claim 15, wherein synchronization further comprises determining a real time when the power outage occurred.

18. The computer-readable storage medium of claim 15, wherein synchronizing further comprises moving the number of relative time intervals stored in memory ahead in memory in order from a newest relative time interval to an oldest relative time interval.

19. The computer-readable storage medium of claim 18, wherein synchronization further comprises zeroing data in respective memory locations for the power failure intervals.

20. The computer-readable storage medium of claim 15, wherein synchronization is power fail tolerant.

* * * * *